US010445551B2

(12) United States Patent
Chen et al.

(10) Patent No.: US 10,445,551 B2
(45) Date of Patent: Oct. 15, 2019

(54) FINGERPRINT IDENTIFICATION DEVICE, MOBILE DEVICE USING THE SAME AND METHOD FOR MANUFACTURING FINGERPRINT IDENTIFICATION DEVICE

(71) Applicant: Eosmem Corporation, Zhubei (TW)

(72) Inventors: Chern-Lin Chen, Zhubei (TW); Shuang-Chin Wu, Zhubei (TW); Ying-Yi Wu, Zhubei (TW)

(73) Assignee: EOSMEM CORPORATION, Taipei (TW)

( * ) Notice: Subject to any disclaimer, the term of this patent is extended or adjusted under 35 U.S.C. 154(b) by 0 days.

(21) Appl. No.: 15/854,421

(22) Filed: Dec. 26, 2017

(65) Prior Publication Data

US 2018/0181788 A1    Jun. 28, 2018

Related U.S. Application Data

(60) Provisional application No. 62/439,674, filed on Dec. 28, 2016.

(51) Int. Cl.
| | | |
|---|---|---|
| *G06K 9/00* | (2006.01) | |
| *G06F 1/16* | (2006.01) | |
| *H01L 27/146* | (2006.01) | |
| *H04M 1/02* | (2006.01) | |

(52) U.S. Cl.
CPC ....... *G06K 9/00053* (2013.01); *G06F 1/1626* (2013.01); *G06K 9/0004* (2013.01); *H01L 27/14623* (2013.01); *H01L 27/14698* (2013.01); *H04M 1/026* (2013.01)

(58) Field of Classification Search
CPC ............. G06K 9/00053; G06K 9/0004; G06F 1/1626; H01L 27/14623; H01L 27/14698; H04M 1/026
See application file for complete search history.

(56) References Cited

U.S. PATENT DOCUMENTS

| | | | | |
|---|---|---|---|---|
| 6,670,221 B2* | 12/2003 | Sakoda | ................ | G06K 9/0002 257/252 |
| 7,109,574 B2* | 9/2006 | Chiu | .................... | G06K 9/0002 257/684 |
| 7,536,039 B2* | 5/2009 | Shinoda | ............. | G06K 9/00013 382/124 |

(Continued)

*Primary Examiner* — Manav Seth
(74) *Attorney, Agent, or Firm* — Muncy, Geissler, Olds & Lowe, P.C.

(57) ABSTRACT

A fingerprint identification device and a method for manufacturing the fingerprint identification device are provided. The fingerprint identification device includes a solder ball array, a re-distribution layer, an image sensing integrated circuit (IC), a light emitting circuit, a photic layer and a molding material. The re-distribution layer disposed on the solder ball array is electrically connected to a plurality of solder balls. The image sensing IC includes a plurality of through silicon vias (TSVs), and the TSVs are correspondingly electrically connected to the solder balls, respectively, through the re-distribution layer. The light emitting circuit is disposed on one side of the image sensing IC, and electrically connected to the image sensing IC through the re-distribution layer. The image sensing IC controls the light emitting circuit. The photic layer is disposed on the image sensing IC. The molding material encloses the image sensing IC.

17 Claims, 17 Drawing Sheets

1102

(56) References Cited

U.S. PATENT DOCUMENTS

| | | | |
|---|---|---|---|
| 8,018,065 B2* | 9/2011 | Lam | H01L 21/56 |
| | | | 257/620 |
| 8,116,540 B2* | 2/2012 | Dean | G06K 9/0002 |
| | | | 382/124 |
| 9,001,081 B2* | 4/2015 | Pope | G06F 3/044 |
| | | | 345/174 |
| 10,157,875 B2* | 12/2018 | Yiu | H01L 23/3114 |
| 10,204,865 B2* | 2/2019 | Hu | H01L 23/5389 |
| 2014/0103943 A1* | 4/2014 | Dunlap | G01N 27/221 |
| | | | 324/663 |
| 2014/0369573 A1* | 12/2014 | Chiu | G06K 9/00013 |
| | | | 382/124 |
| 2015/0036065 A1* | 2/2015 | Yousefpor | G06K 9/228 |
| | | | 349/12 |
| 2017/0117200 A1* | 4/2017 | Kim | H01L 21/561 |
| 2017/0372119 A1* | 12/2017 | Lee | G06K 9/0002 |
| 2018/0005064 A1* | 1/2018 | Vogel | G06K 9/209 |
| 2018/0076278 A1* | 3/2018 | Wang | H01L 21/56 |
| 2018/0102321 A1* | 4/2018 | Ho | H01L 27/14618 |
| 2018/0150667 A1* | 5/2018 | Yu | G06K 9/0002 |
| 2018/0173932 A1* | 6/2018 | Huang | G06K 9/00053 |
| 2018/0175092 A1* | 6/2018 | Yiu | H01L 27/14634 |
| 2018/0226312 A1* | 8/2018 | Kim | H01L 21/561 |
| 2018/0276449 A1* | 9/2018 | Pope | G06F 3/044 |

* cited by examiner

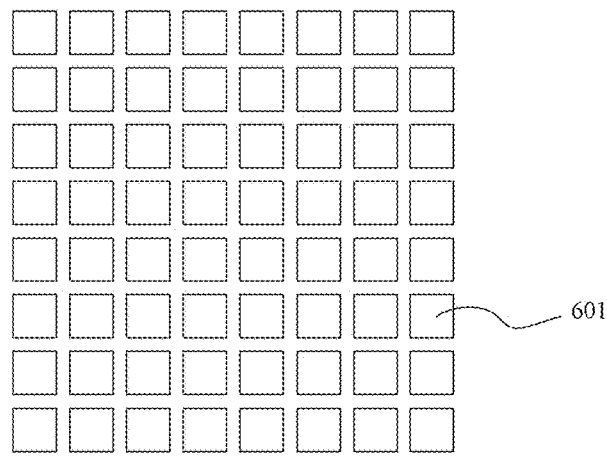
FIG. 6
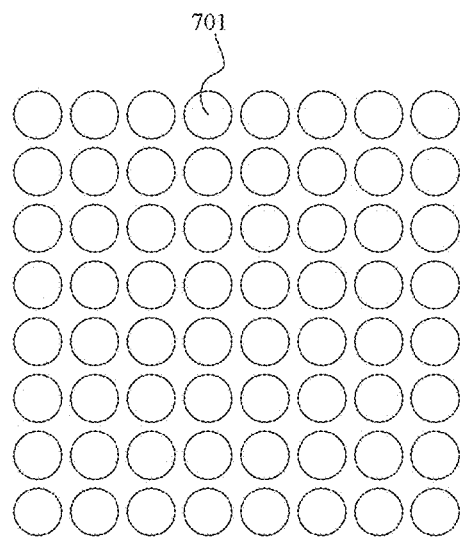 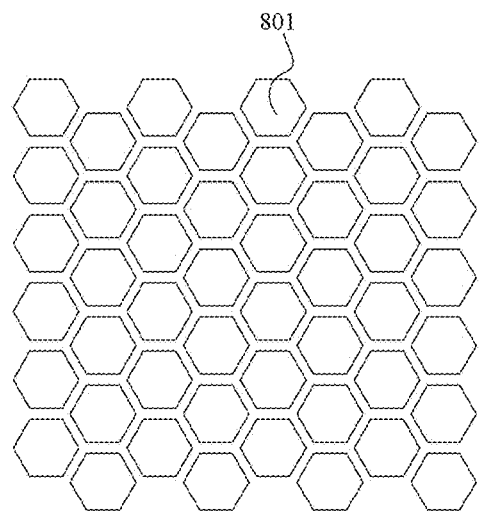
FIG. 7    FIG. 8

FINGERPRINT IDENTIFICATION DEVICE, MOBILE DEVICE USING THE SAME AND METHOD FOR MANUFACTURING FINGERPRINT IDENTIFICATION DEVICE

CROSS-REFERENCE TO RELATED APPLICATIONS

This application claims priority to U.S. Provisional Patent Application Ser. No. 62/439,674 filed on Dec. 28, 2016 which is incorporated herein by reference in its entirety.

BACKGROUND OF THE INVENTION

Field of the Invention

The present invention relates to the technology of manufacturing a fingerprint identification device, and more particularly to a fingerprint identification device and a method for manufacturing the fingerprint identification device.

Description of the Related Art

Because the modern products are emphasized to be slim and light, many separate circuits are integrated into integrated circuits. FIG. 1 is a structure view showing a fingerprint input device disclosed by the prior art. Referring to FIG. 1, the conventional fingerprint input device includes a substrate 100, a two-dimensional image sensor 101 and a light emitting diode 102. The light emitting diode 102 emits light of a specified wavelength to the finger, and the finger reflects scattered light. The two-dimensional image sensor 101 directly receives the above-mentioned scattered light from ridge portions of the finger, and the scattered light scattered by valley portions of the finger diffuses. However, the light of the light emitting diode 102 is directly emitted to the two-dimensional image sensor 101, and this often causes the fingerprint captured by the two-dimensional image sensor 101 to be unclear and causes the failure of the fingerprint identification.

FIG. 2 is a structure view showing the fingerprint input device disclosed by the prior art. Referring to FIG. 2, in addition to the above-mentioned substrate 100, the above-mentioned two-dimensional image sensor 101 and the above-mentioned light emitting diode 102, the conventional fingerprint input device further includes an obstructing wall 201, and the obstructing wall 201 can obstruct the direct light emitted from the light emitting diode 102 to the two-dimensional image sensor 101. However, the manufacturing of the above-mentioned obstructing wall 201 is not easy, and the obstructing wall 201 tends to tilt down and get damaged.

Furthermore, in the package structure, because the two-dimensional image sensor 101 and the light emitting diode 102 are bonded onto the substrate 100 and then packaged and the general substrate is a printed circuit board, the volume can not be further reduced. Also, among the advanced package processes, there is a process named as the fan in wafer level package (Fan In WLP) process. The characteristic of the process is that the entire wafer that is not diced is turned up side down, and the re-distribution is performed from the bonding pads. Thereafter, dicing is performed, so that the package is completed. The package can extremely miniaturize the integrated circuit. However, the wafer level package is not applicable to the sensing integrated circuit, such as the fingerprint identification integrated circuit. The reason is that the sensing surface of the sensing integrated circuit after being packaged must face upwards, and must be able to sense the light. However, in the package process, the integrated circuit is turned up side down, so the sensing surface of the sensing integrated circuit after being packaged faces downwards, and the sensing can not be performed.

BRIEF SUMMARY OF THE INVENTION

An objective of the present invention is to provide a fingerprint identification device, a mobile device using the same and a manufacturing method of the fingerprint identification device. The fingerprint identification device can integrate the light emitting diode, and use the light emitting diode to supplement the light to make the fingerprint clearer. In addition, in the fingerprint identification device of the integrated light emitting diode, it is possible to prevent the light ray of the light emitting diode from being directly emitted to the image sensing IC, so that the effects of preventing crosstalk and interference are obtained.

Another objective of the present invention is to provide a fingerprint identification device and a method for manufacturing the fingerprint identification device in order to miniaturize and integrate the fingerprint identification device and the auxiliary light source more efficiently.

In view of this, the present invention provides a fingerprint identification device including a solder ball array, a re-distribution layer (RDL), an image sensing IC, a light emitting circuit, a photic layer and a molding material. The solder ball array includes a plurality of solder balls. The re-distribution layer is disposed on the solder ball array, and electrically connected to the above-mentioned solder balls. The image sensing IC includes a plurality of through silicon vias (TSVs), and each of the TSVs includes an electroconductive material, wherein the TSVs are correspondingly electrically connected to the solder balls, respectively, through the re-distribution layer. The light emitting circuit is disposed on one side of the image sensing IC, emits a specified light source, and includes a first connecting conductor, which is electrically connected to a specific one of the TSVs of the image sensing IC through the re-distribution layer, wherein the image sensing IC controls the light emitting circuit through the specific TSV. The photic layer is disposed on the image sensing IC, wherein the photic layer allows the light ray to pass through and enter the image sensing IC. The molding material encloses the image sensing IC, wherein the molding material obstructs a light traveling path between the light emitting circuit and the image sensing IC to prevent directly illuminating light of the light emitting circuit from entering the image sensing IC to enhance a fingerprint identification quality.

The present invention further provides a mobile device including a control circuit, a display panel, a protective cover and a fingerprint identification device. The display panel is electrically connected to the control circuit. The protective cover is disposed on the display panel. The fingerprint identification device includes a solder ball array, a re-distribution layer (RDL), an image sensing IC, a light emitting circuit, a photic layer and a molding material. The solder ball array includes a plurality of solder balls. The re-distribution layer is disposed on the solder ball array, and electrically connected to the above-mentioned solder balls. The image sensing IC includes a plurality of through silicon vias (TSVs), and each of the TSVs includes an electroconductive material, wherein the TSVs are correspondingly electrically connected to the solder balls, respectively, through the re-distribution layer. The light emitting circuit is disposed on one side of the image sensing IC, emits a specified light source, and includes a first connecting conductor, which is electrically connected to a specific one of the TSVs of the image sensing IC through the re-distribution layer, wherein the image sensing IC controls the light emitting circuit through the specific TSV. The photic layer is disposed on the image sensing IC, wherein the photic layer allows the light ray to pass through and enter the image sensing IC. The molding material encloses the image sensing IC, wherein the molding material obstructs a light traveling path between the light emitting circuit and the image sensing IC to prevent directly illuminating light of the light emitting circuit from entering the image sensing IC to enhance a fingerprint identification quality.

In the fingerprint identification device and the mobile device according to a preferred embodiment of the present invention, the photic layer includes a spatial filter disposed on the image sensing IC, wherein the spatial filter has multiple neighboring light channels, wherein the light channel restricts an angle of light entering the image sensing IC to prevent scattered light from entering the image sensing IC. Moreover, in another preferred embodiment, the light channels of the spatial filter constitute a two-dimensional array.

In the fingerprint identification device and the mobile device according to a preferred embodiment of the present invention, the light emitting circuit includes a specific light emitting circuit, which is disposed on one side of the image sensing IC and electrically connected to the image sensing IC. In another preferred embodiment, the light emitting circuit includes a visible light emitting circuit disposed on the one side of the image sensing IC and electrically connected to the image sensing IC, wherein when a fingerprint identification is performed, the visible light emitting circuit emits visible light to make a user obtain a finger placement position through the visible light. Moreover, In another preferred embodiment, the sensing surface of the image sensing IC faces upwards.

The present invention further provides a method for manufacturing fingerprint identification devices, the method includes the steps of: bonding an image sensing integrated circuit (IC) wafer to a first carrier, wherein image sensing surfaces of the image sensing IC wafer are bonded to the first carrier; performing a through silicon via (TSV) process on the image sensing IC wafer on the first carrier; de-bonding the image sensing IC wafer from the first carrier; bonding a second carrier to a TSV processing surface of the image sensing IC wafer; disposing a photic layer on each of sensing surfaces of image sensing ICs on the image sensing IC wafer; de-bonding the image sensing IC wafer from the second carrier; dicing the image sensing IC wafer to obtain the image sensing ICs; bonding the image sensing ICs to a third carrier, and disposing a light emitting circuit on one side of each of the image sensing ICs; performing a molding process on each of the image sensing ICs and each of the corresponding light emitting circuits to obtain an undiced mold; de-bonding the undiced mold from the third carrier; disposing a re-distribution layer on a de-bonding surface of the undiced mold; disposing a solder ball array on a process surface of the re-distribution layer; performing a grinding process on a molding surface of the undiced mold to expose the photic layer on each of the image sensing ICs and a photic material of the light emitting circuit; and performing a dicing process to obtain the fingerprint identification device.

In the method for manufacturing fingerprint identification devices according to a preferred embodiment of the present invention, before the dicing process, the coating process is performed to cover a protection film on the photic layer on each of the image sensing ICs and the photic material of the light emitting circuit. In addition, disposing the re-distribution layer on the de-bonding surface of the undiced mold further comprises: forming a first polymer layer on the de-bonding surface of the undiced mold; and performing a re-distribution process on the de-bonding surface of the undiced mold so that TSVs of the image sensing IC wafer are electrically connected to externally disposed metal bumps.

In the method for manufacturing fingerprint identification devices according to a preferred embodiment of the present invention, disposing the solder ball array on the process surface of the re-distribution layer comprises: disposing solder balls on the re-distribution layer; and disposing a second polymer layer on the process surface of the re-distribution layer.

The essence of the present invention resides in a photic layer disposed above the image sensing IC used in the fingerprint identification, and the photic layer allows the light ray to pass. Thereafter, the light emitting circuit and the image sensing IC used in the fingerprint identification are packaged in the same integrated circuit by way of packaging. Accordingly, the light emitting circuit and the image sensing IC used in the fingerprint identification can be integrated into the same integrated circuit. Because the mold material encloses the above-mentioned image sensing IC used in the fingerprint identification in the package, a natural light obstructing member is constituted between the image sensing IC and the light emitting circuit. Thus, it is possible to prevent the light ray of the light emitting circuit from being directly incident to the image sensing IC used in the fingerprint identification, so that the read fingerprint is clearer.

In addition, in order to further reduce the volume of the fingerprint identification device, after the fingerprint identification integrated circuits have been manufactured on the wafer in the production process, the back of the wafer is firstly thinned. Then, the TSV technology is performed on the needed input/output pins to pull out the metal contact points under the wafer to fix the input/output nodes of the fingerprint identification integrated circuits under the wafer. Thereafter, the above-mentioned input/output nodes are pulled out through the re-distribution layer, and the photic layer is disposed above the fingerprint identification surface. Then, the wafer is diced into individual chips of the fingerprint identification integrated circuits, each the individual chips is bonded to a carrier, and the light emitting circuits are disposed around the chip. Thereafter, the processes, such as molding, solder ball arranging, dicing and the like, are performed to obtain multiple fingerprint identification devices. Accordingly, each of the fingerprint identification devices can be further reduced, and the volume and the cost are reduced.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the present invention will become apparent to those skilled in the art from this detailed description.

BRIEF DESCRIPTION OF THE SEVERAL VIEWS OF THE DRAWINGS

FIG. 6 is a top view showing a spatial filter 504 of the fingerprint identification device according to a preferred embodiment of the present invention.

FIG. 7 is a top view showing the spatial filter 504 of the fingerprint identification device according to a preferred embodiment of the present invention.

FIG. 8 is a top view showing the spatial filter 504 of the fingerprint identification device according to a preferred embodiment of the present invention.

DETAILED DESCRIPTION OF THE INVENTION

Figure 1:
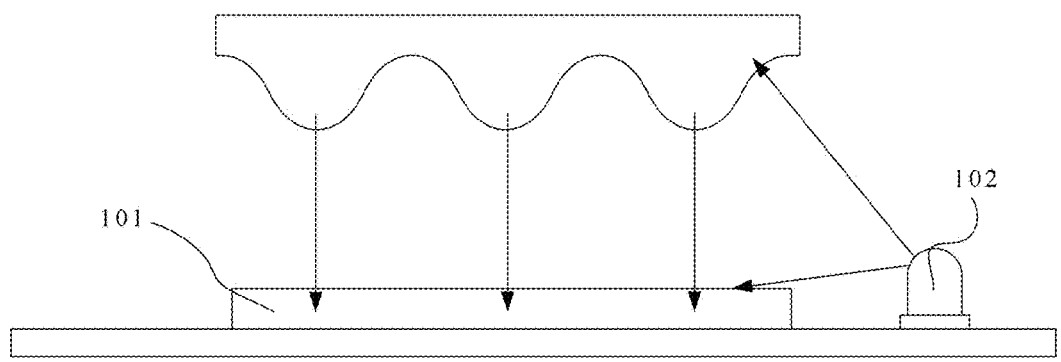
FIG. 1 is a structure view showing an organic light-emitting diode component of the prior art.
Figure 2:
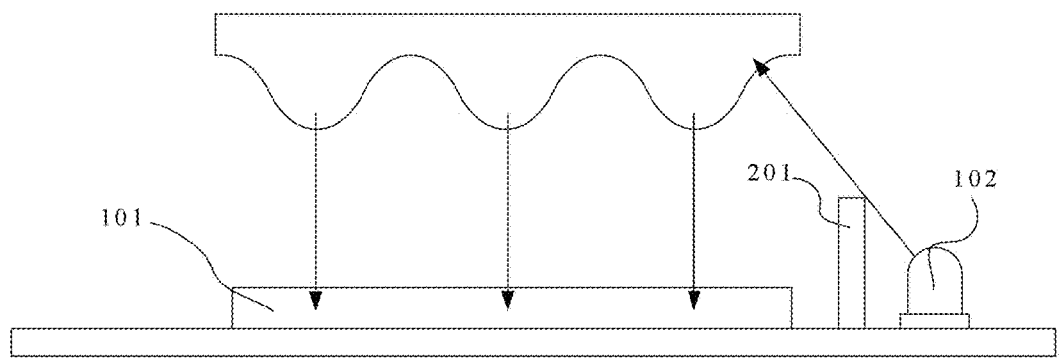
FIG. 2 is a structure view showing a white light organic light-emitting diode component of the prior art.

In the embodiments and claims, spatially relative terms, such as "underlying," "below," "lower," "overlying," "upper" and the like, may be used herein for ease of description to describe one element or feature's relationship to another element(s) or feature(s) as illustrated in the figures. Those skilled in the art may understand that the spatially relative terms are intended to encompass different orientations of the apparatus in use or operation in addition to the orientation depicted in the figures. For example, if an apparatus in the drawing is turned over, elements or features described as "below" or "beneath" other elements or features would then be oriented "above" the other elements. The terms "below" or "beneath" can, therefore, encompass both an orientation of above and below. If the apparatus may be otherwise oriented (rotated 90 degrees or at other orientations), then the spatially relative descriptors used herein may likewise be interpreted accordingly.

Figure 3:
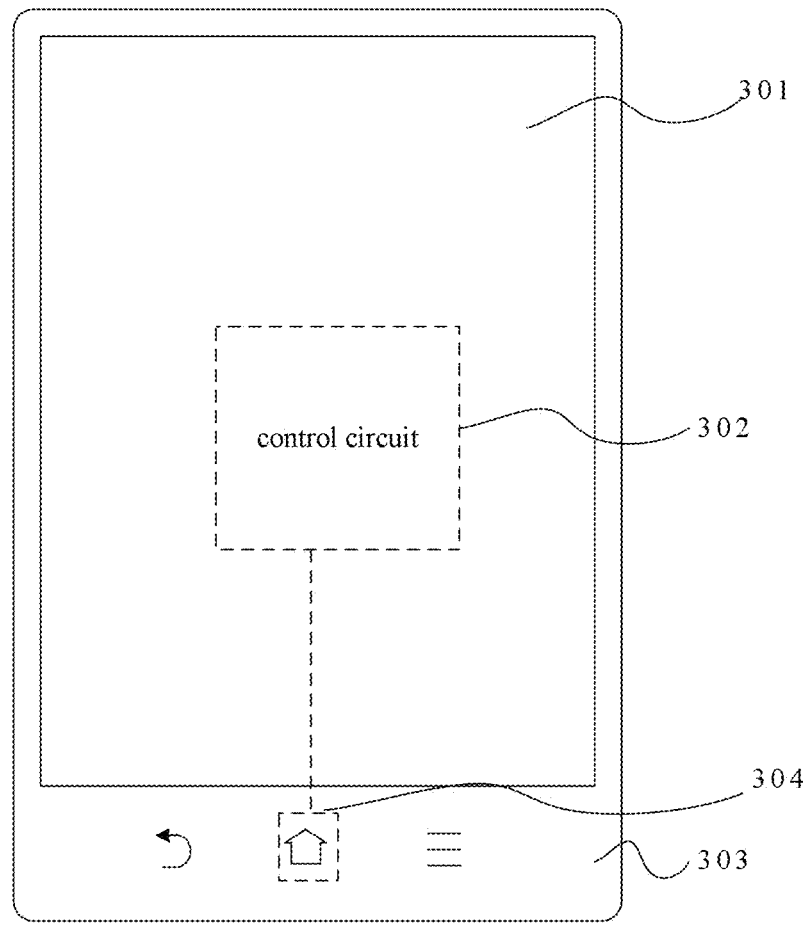
FIG. 3 is a schematic view showing a mobile device according to a preferred embodiment of the present invention.

FIG. 3 is a schematic view showing a mobile device according to a preferred embodiment of the present invention. Referring to FIG. 3, the above-mentioned mobile device of this embodiment includes a display panel 301, a control circuit 302, a covering protection layer 303 and a fingerprint identification device 304. In this embodiment, the covering protection layer 303 is disposed above the display panel, and covers the whole mobile device. The fingerprint identification device 304 is disposed below the covering protection layer 303. Generally speaking, if the current smart phone is taken as an example, the covering protection layer 303 is implemented as the protective glass. The control circuit 302 is electrically connected to the display panel 301 and the fingerprint identification device 304 to control the display panel 301 and the fingerprint identification device 304. In this embodiment, the fingerprint identification device 304 is disposed on the covering protection layer 303, that is, below the protective glass. In addition, the fingerprint identification device 304 is disposed below a virtual touch button (home key) in this embodiment.

Figure 4:
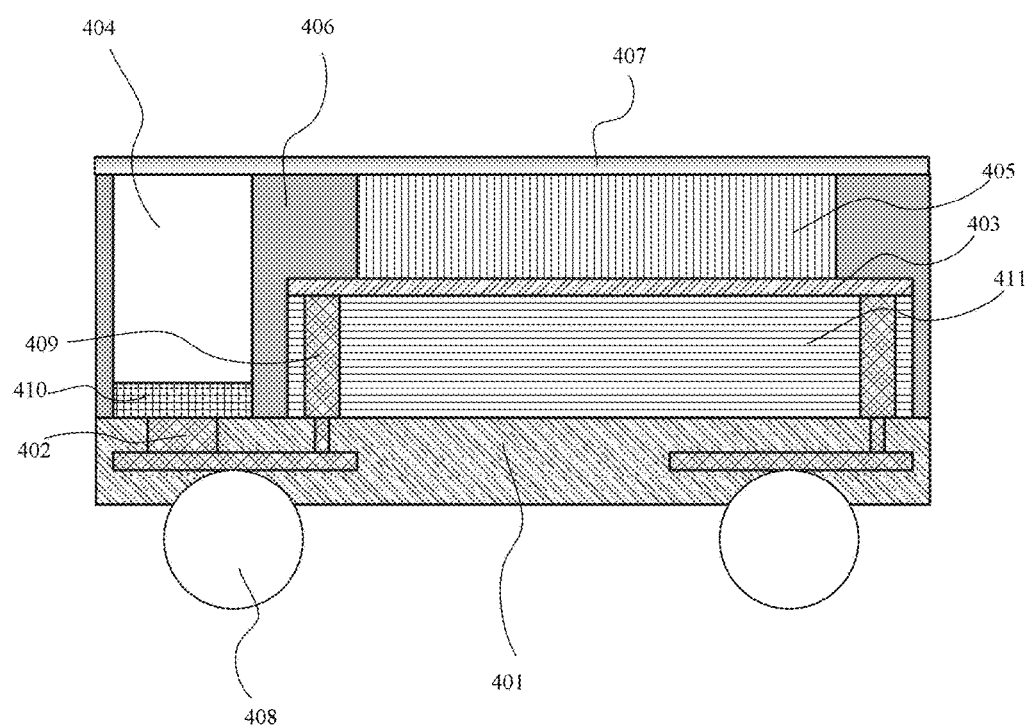
FIG. 4 is structure view showing a fingerprint identification device 304 according to a preferred embodiment of the present invention.

FIG. 4 is structure view showing a fingerprint identification device 304 according to a preferred embodiment of the present invention. Referring to FIG. 4, the fingerprint identification device includes a polymer layer 401, a re-distribution layer (RDL) 402, an image sensing IC 403, a light emitting circuit 404, a photic layer 405, a molding material 406, a protection coating film 407 and a plurality of solder balls 408. The light emitting circuit 404 includes a light emitting circuit carrier 410. A wafer substrate 411 is disposed below the image sensing IC 403. In this embodiment, the image sensing IC 403 includes a plurality of through silicon vias (TSVs) 409, and each of the TSVs 409 has an electroconductive material. In this embodiment, the TSVs 409 are electrically connected to the output/input pads (I/O pads) of the image sensing IC 403. These TSVs 409 are correspondingly electrically connected to the above-mentioned solder balls 408, respectively, through the re-distribution layer 402. Accordingly, the output/input pads of the image sensing IC 403 are electrically connected to the above-mentioned solder balls 408, respectively.

In addition, another effect of the re-distribution layer 402 is to electrically connect the specific TSV, which is for controlling and electrically connected to the bonding pad of the light emitting circuit 404 in the image sensing IC 403, to the light emitting circuit 404. Accordingly, when the fingerprint identification is performed, the image sensing IC 403 can control the light emitting circuit 404 to emit a specified light source for providing the light ray to the finger, so that the fingerprint image of the finger is clearer. The photic layer 405 is disposed on the image sensing IC 403, wherein the photic layer 405 can make the light ray pass through and enter the image sensing IC 403. The molding material 406 encloses the image sensing IC 403, wherein the molding material 406 obstructs the light travelling path between the light emitting circuit 404 and the image sensing IC 403 to prevent the directly illuminated light of the above-mentioned light emitting circuit 404 from entering the image sensing IC 403, and to enhance the fingerprint identification quality.

Figure 5:
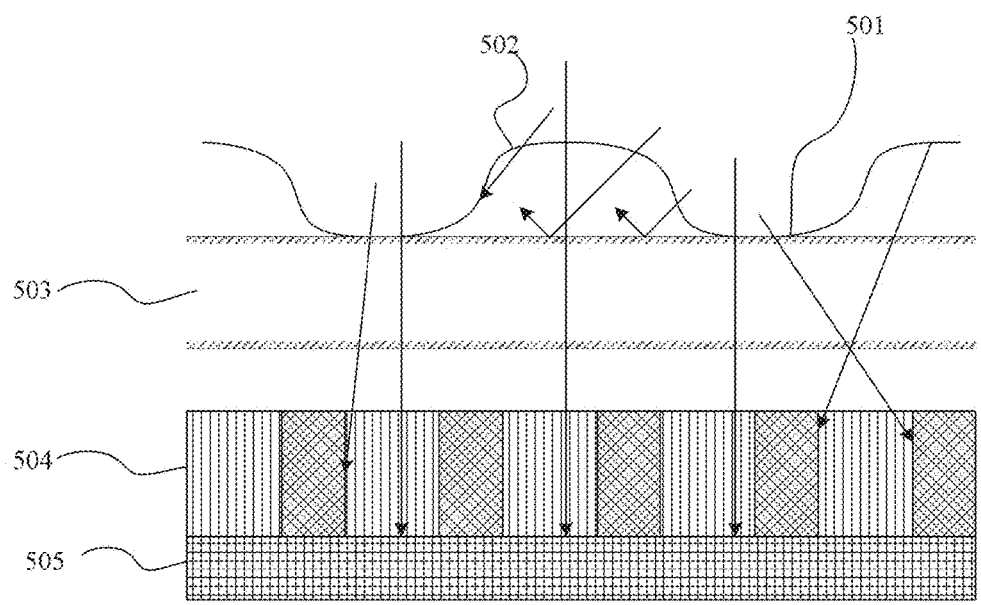
FIG. 5 is a schematic view showing the operation of the fingerprint identification device according to a preferred embodiment of the present invention.

FIG. 5 is a schematic view showing the operation of the fingerprint identification device according to a preferred embodiment of the present invention. Referring to FIG. 5, symbol 501 represents the ridge portion of the fingerprint of the finger; symbol 502 represents the valley portion of the fingerprint of the finger; symbol 503 represents the protective glass; symbol 504 represents the spatial filter; and symbol 505 represents the image sensing IC. In the schematic view, the photic layer is implemented as the spatial filter 504, the spatial filter 504 has the effects of filtering out the scattered light, and allowing the directly emitted light to enter the image sensing IC. As can be seen from the embodiment, the directly emitted light ray can pass through the spatial filter 504 and enter the image sensing IC 505. The scattered light caused by the valley portion of the fingerprint of the finger can be reflected by the protective glass and obstructed or absorbed by the non-light-channel portion in the spatial filter 504, and the scattered light caused by the ridge portion of the fingerprint of the finger can be obstructed or absorbed by the non-light-channel portion in the spatial filter 504. Thus, the image sensing IC 505 receives only the light ray that is substantially directed to the image sensing IC 505, and does not receive the scattered light, so the image quality of the fingerprint can be improved. However, the present invention is not restricted to the implementation method of the photic layer.

As can be seen from the above-mentioned embodiment, the fingerprint identification device of this invention adopts the method of directly capturing the fingerprint. So, when the fingerprint is being captured, the ridge portion of the fingerprint captured by this invention is bright, and the valley portion of the fingerprint of the finger is dark. The fingerprint identification device generally requiring the optical device adopts the total reflection fingerprint capturing, and a prism or a light guide layer is usually provided. The fingerprint identification device much more differs from this invention in that the ridge portion of the captured fingerprint is dark, and the valley portion of the fingerprint of the finger is bright. Also, the ordinary direct capturing type fingerprint identification device needs to capture the fingerprint when the fingerprint is extremely close to the image sensing IC 403. Because a spatial filter 504 is disposed in this invention, the fingerprint identification device of this invention still can capture the fingerprint even if the finger is at a distance from the image sensing IC 403.

FIG. 6 is a top view showing the spatial filter 504 of the fingerprint identification device according to a preferred embodiment of the present invention. Referring to FIG. 6, symbol 601 represents the light channel. In this embodiment, the light channel 601 of the spatial filter 504 is square, and the light channel 601 of the entire spatial filter 504 is configured as a rectangular matrix. FIG. 7 is a top view showing the spatial filter 504 of the fingerprint identification device according to a preferred embodiment of the present invention. Referring to FIG. 7, in this embodiment, a light channel 701 of the spatial filter 504 is circular, and the light channel 701 of the entire spatial filter 504 is configured as a rectangular matrix. FIG. 8 is a top view showing the spatial filter 504 of the fingerprint identification device according to a preferred embodiment of the present invention. Referring to FIG. 8, in this embodiment, a light channel 801 of the spatial filter 504 is hexagonal, and the light channel 801 of the entire spatial filter 504 is configured as a honeycomb shape.

Figure 9:
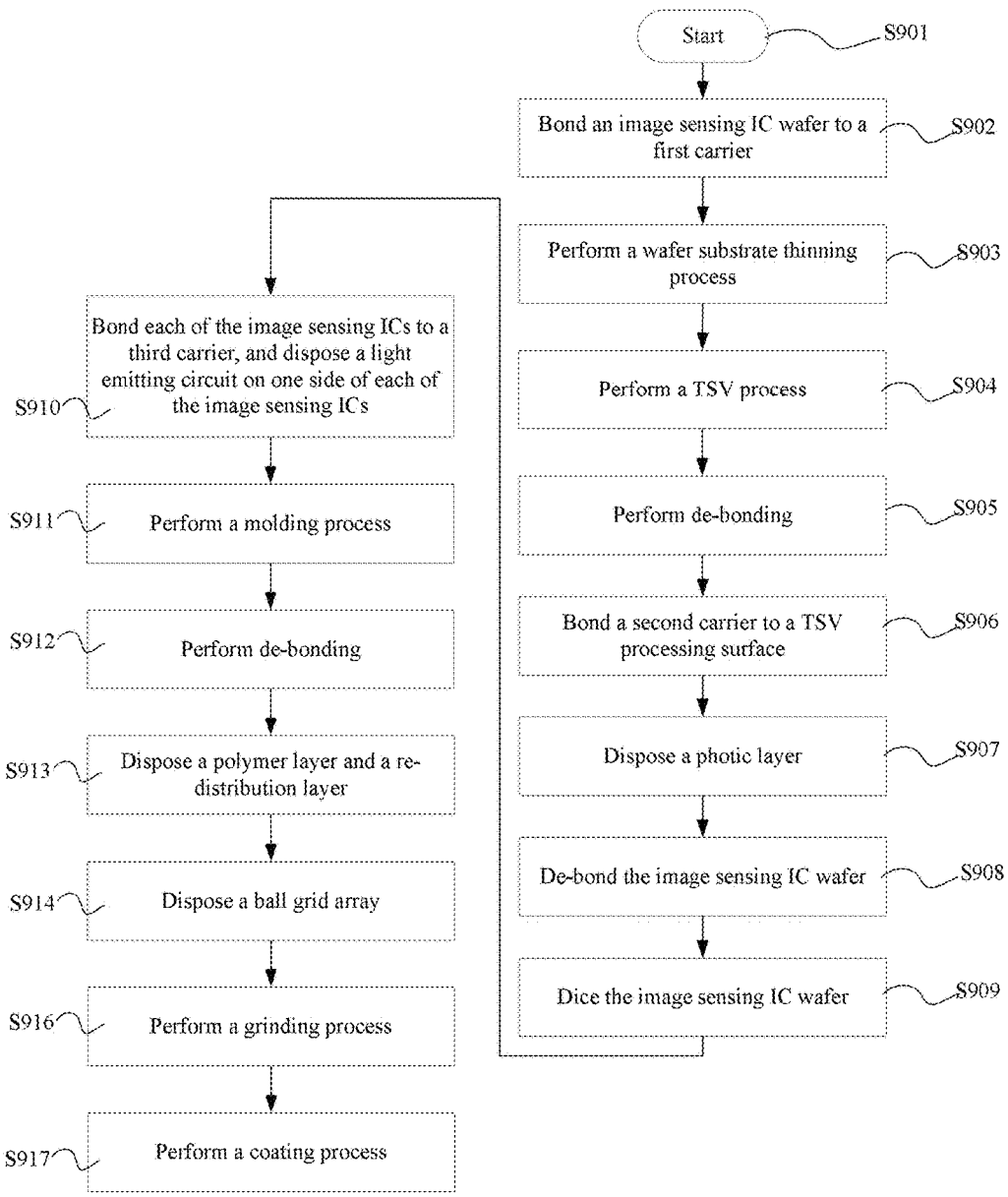
FIG. 9 is a flow chart showing a manufacturing method of the fingerprint identification device according to a preferred embodiment of the present invention.

FIG. 9 is a flow chart showing a manufacturing method of the fingerprint identification device according to a preferred embodiment of the present invention. Referring to FIG. 9, the manufacturing method of the fingerprint identification device includes the following steps.

In a step S901, the manufacturing method of the fingerprint identification device starts.

Figure 9A:
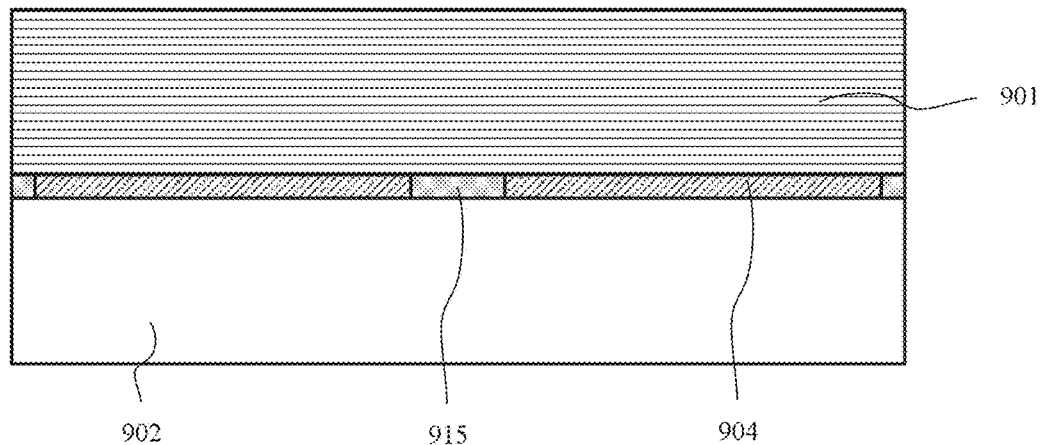
FIG. 9A is a schematic view showing a step S902 of the manufacturing method of the fingerprint identification device according to a preferred embodiment of the present invention.

In a step S902, an image sensing IC wafer is bonded to a first carrier, wherein image sensing surfaces of the image sensing IC wafer are bonded to the carrier, as shown in FIG. 9A. FIG. 9A is a schematic view showing the step S902 of the manufacturing method of the fingerprint identification device according to a preferred embodiment of the present invention. Referring to FIG. 9A, symbol 901 represents the image sensing IC wafer; and symbol 902 represents the first carrier for carrying the wafer. As can be seen from FIG. 9A, the image sensing IC wafer 901 is bonded to the first carrier

902. Symbol 915 represents the scribe line, and is used to reserve the position for the integrated circuit dicing.

Figure 9B:
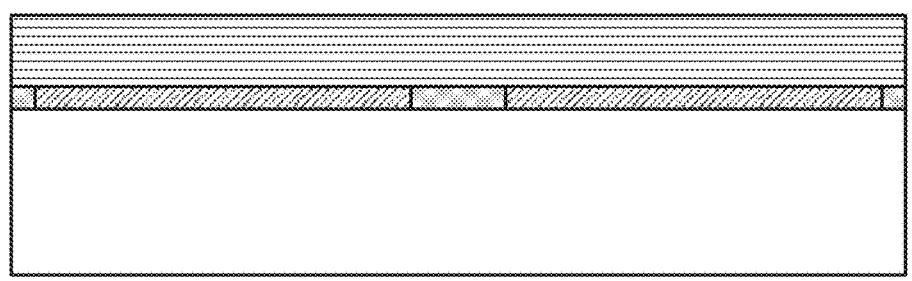
FIG. 9B is a schematic view showing a step S903 of the manufacturing method of the fingerprint identification device according to a preferred embodiment of the present invention.

In a step S903, a wafer thinning process is performed, as shown in FIG. 9B. FIG. 9B is a schematic view showing the step S903 of the manufacturing method of the fingerprint identification device according to a preferred embodiment of the present invention. As shown in FIG. 9B, the thickness of the wafer substrate is thinned in order to facilitate the subsequent TSV process.

Figure 9C:
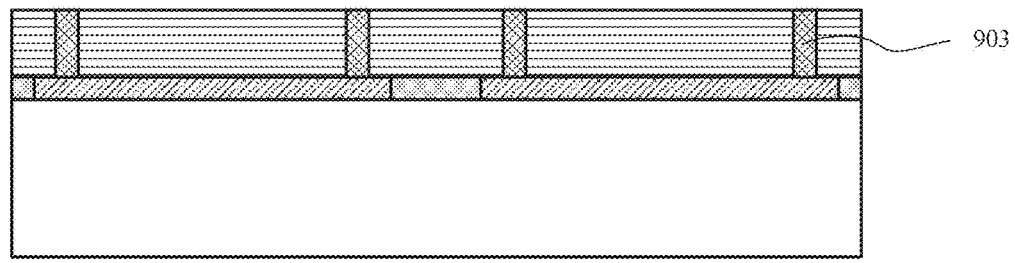
FIG. 9C is a schematic view showing a step S904 of the manufacturing method of the fingerprint identification device according to a preferred embodiment of the present invention.

In a step S904, a TSV process is performed on the image sensing IC wafer on the first carrier, as shown in FIG. 9C. FIG. 9C is a schematic view showing the step S904 of the manufacturing method of the fingerprint identification device according to a preferred embodiment of the present invention. As shown in FIG. 9C, symbol 903 represents the TSV. Drilling and conductor filling are performed from the substrate to the input/output points, such as bonding pads to be led out, on the image sensing IC.

Figure 9D:
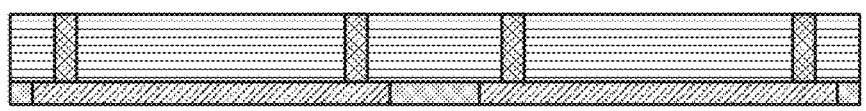
FIG. 9D is a schematic view showing a step S905 of the manufacturing method of the fingerprint identification device according to a preferred embodiment of the present invention.
Figure 9D:
Figure 9D:
Figure 9D:
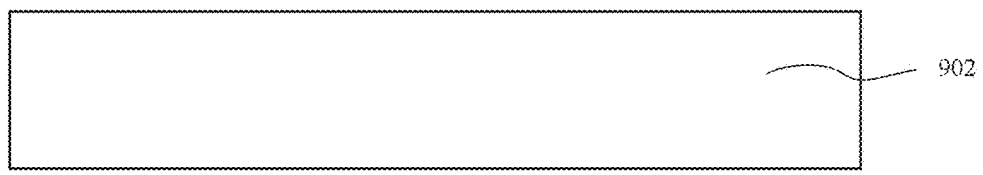

In a step S905, the image sensing IC wafer is de-bonded from the first carrier, as shown in FIG. 9D. FIG. 9D is a schematic view showing the step S905 of the manufacturing method of the fingerprint identification device according to a preferred embodiment of the present invention. As shown in FIG. 9D, the carrier 902 and the image sensing IC wafer obtained after the TSV process is finished are separated from each other.

Figure 9E:
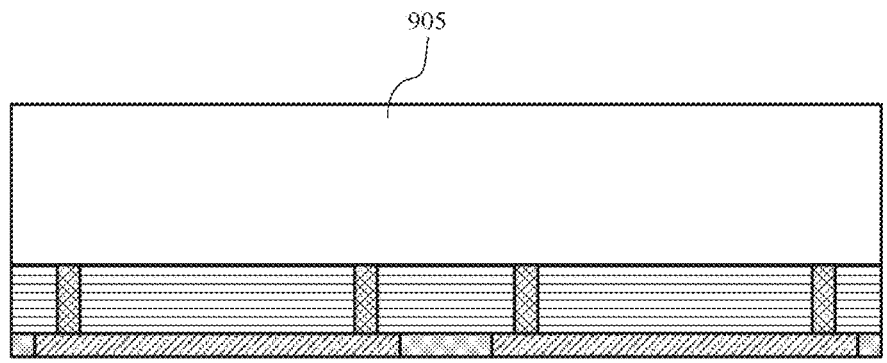
FIG. 9E is a schematic view showing a step S906 of the manufacturing method of the fingerprint identification device according to a preferred embodiment of the present invention.

In a step S906, the TSV processing surface of the image sensing IC wafer, that is, the substrate surface of the wafer, is bonded to a second carrier 905, as shown in FIG. 9E. FIG. 9E is a schematic view showing the step S906 of the manufacturing method of the fingerprint identification device according to a preferred embodiment of the present invention. Referring to FIG. 9E, the TSV processing surface of the image sensing IC wafer (i.e., the substrate surface of the wafer) in this embodiment is bonded to the carrier 905. Those skilled in the art should know that the carrier 905 and the carrier 904 in the step S905 can be the same or different components, and the present invention is not restricted thereto.

Figure 9F:
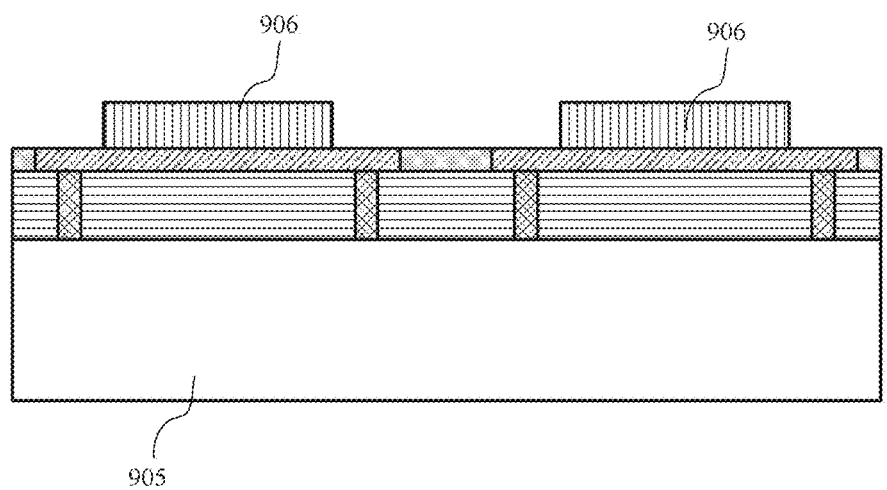
FIG. 9F is a schematic view showing a step S907 of the manufacturing method of the fingerprint identification device according to a preferred embodiment of the present invention.

In a step S907, a photic layer 906 is disposed on each of sensing surfaces of image sensing ICs on the image sensing IC wafer, as shown in FIG. 9F. FIG. 9F is a schematic view showing the step S907 of the manufacturing method of the fingerprint identification device according to a preferred embodiment of the present invention. Referring to FIG. 9F, the photic layer 906 is disposed on each of image sensing IC blocks.

Figure 9G:
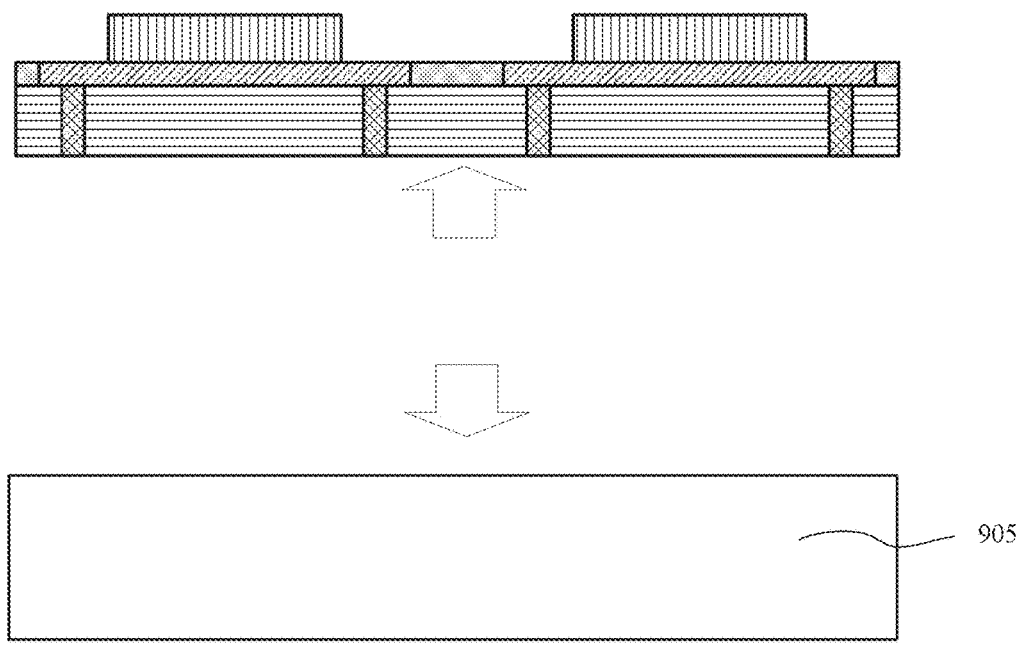
FIG. 9G is a schematic view showing a step S908 of the manufacturing method of the fingerprint identification device according to a preferred embodiment of the present invention.

In a step S908, the image sensing IC wafer is de-bonded from the second carrier 905, as shown in FIG. 9G. FIG. 9G is a schematic view showing the step S908 of the manufacturing method of the fingerprint identification device according to a preferred embodiment of the present invention. Referring to FIG. 9G the image sensing IC wafer and the second carrier 905 are separated from each other.

Figure 9H:
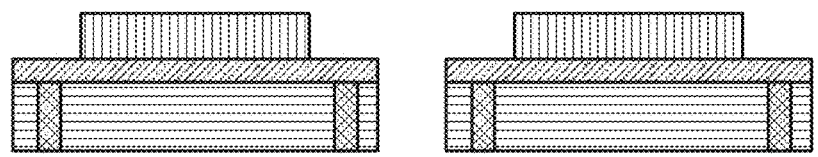
FIG. 9H is a schematic view showing a step S909 of the manufacturing method of the fingerprint identification device according to a preferred embodiment of the present invention.

In a step S909, the image sensing IC wafer is diced to obtain the image sensing ICs, as shown in FIG. 9H. FIG. 9H is a schematic view showing the step S909 of the manufacturing method of the fingerprint identification device according to a preferred embodiment of the present invention. In FIG. 9H, although two image sensing ICs are schematically depicted, those skilled in the art should know that one wafer may have more than two image sensing ICs. So, the present invention is not restricted thereto.

Figure 9I:
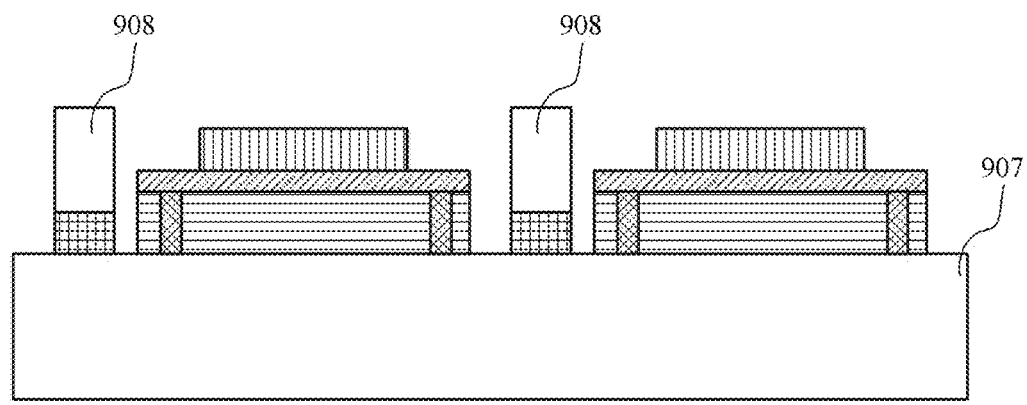
FIG. 9I is a schematic view showing a step S910 of the manufacturing method of the fingerprint identification device according to a preferred embodiment of the present invention.

In a step S910, the above-mentioned image sensing ICs are respectively bonded to a third carrier 907, and a light emitting circuit 908 is disposed on one side of each of the image sensing ICs, as shown in FIG. 9I. FIG. 9I is a schematic view showing the step S910 of the manufacturing method of the fingerprint identification device according to a preferred embodiment of the present invention.

Figure 9J:
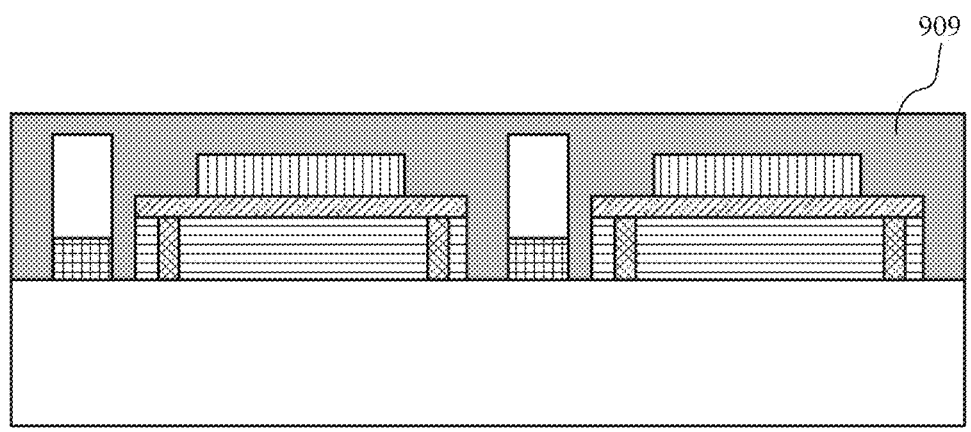
FIG. 9J is a schematic view showing a step S911 of the manufacturing method of the fingerprint identification device according to a preferred embodiment of the present invention.

In a step S911, a molding process is performed on each of the image sensing ICs and each of the corresponding light emitting circuits to obtain a reconstruction wafer of an undiced mold, as shown in FIG. 9J. FIG. 9J is a schematic view showing the step S911 of the manufacturing method of the fingerprint identification device according to a preferred embodiment of the present invention. Referring to FIG. 9J, the mold material 909 of this embodiment used in the molding process is, generally speaking, an epoxy resin. However, the present invention is not restricted thereto.

Figure 9K:
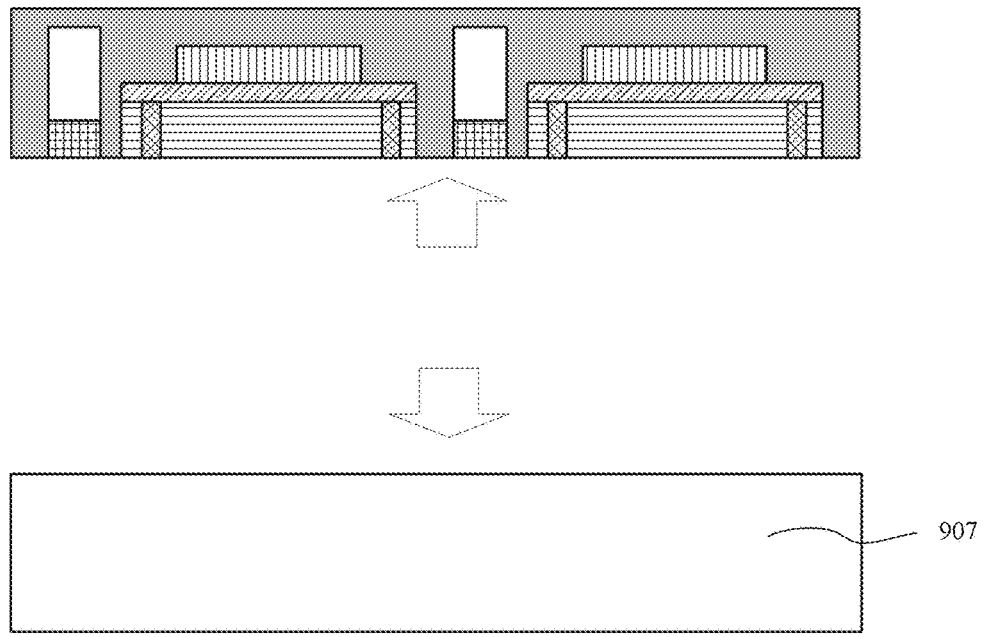
FIG. 9K is a schematic view showing a step S912 of the manufacturing method of the fingerprint identification device according to a preferred embodiment of the present invention.

In a step S912: the reconstruction wafer is de-bonded from the third carrier, as shown in FIG. 9K. FIG. 9K is a schematic view showing the step S912 of the manufacturing method of the fingerprint identification device according to a preferred embodiment of the present invention. Referring to FIG. 9K, the above-mentioned reconstruction wafer and the third carrier 907 are separated from each other.

Figure 9L:
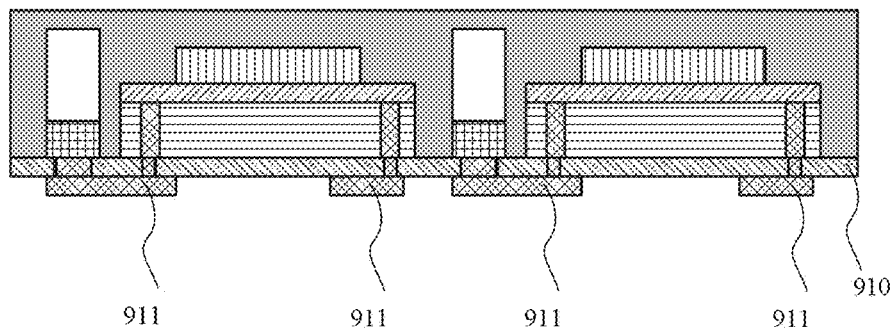
FIG. 9L is a schematic view showing a step S913 of the manufacturing method of the fingerprint identification device according to a preferred embodiment of the present invention.

In a step S913, a polymer layer and a re-distribution layer are disposed on a de-bonding surface of the reconstruction wafer, as shown in FIG. 9L. FIG. 9L is a schematic view showing the step S913 of the manufacturing method of the fingerprint identification device according to a preferred embodiment of the present invention. Referring to FIG. 9L, through the electrical insulation of a polymer layer 912 and the arrangement of a re-distribution layer 911, the input/output nodes of the image sensing IC to be led out are electrically connected to the re-distribution layer 911 through the TSVs.

Figure 9M:
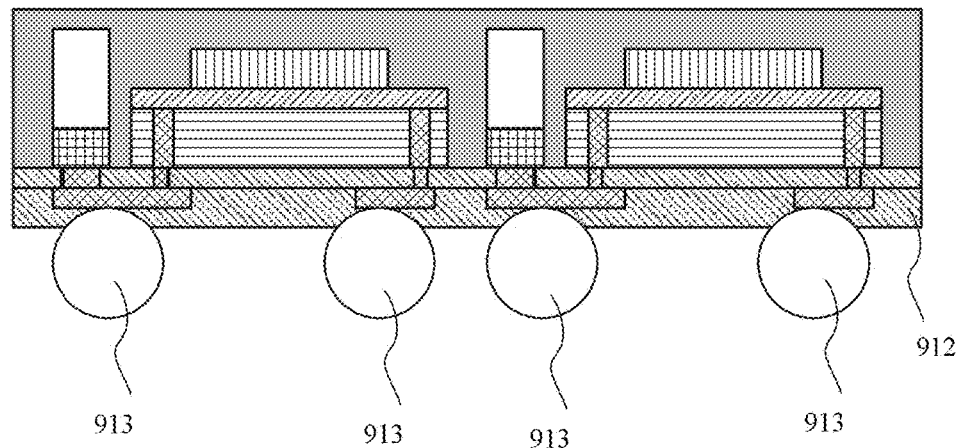
FIG. 9M is a schematic view showing a step S914 of the manufacturing method of the fingerprint identification device according to a preferred embodiment of the present invention.

In a step S914, a polymer layer is disposed on and solder balls are embedded into a process surface of the re-distribution layer of the reconstruction wafer, as shown in FIG. 9M. FIG. 9M is a schematic view showing the step S914 of the manufacturing method of the fingerprint identification device according to a preferred embodiment of the present invention. Referring to FIG. 9M, the input/output nodes of the image sensing IC to be led out are electrically connected to the solder balls 913, respectively, through the electrical insulation of the polymer layer and the arrangement of the protection 912 and the solder balls 913.

Figure 9N:
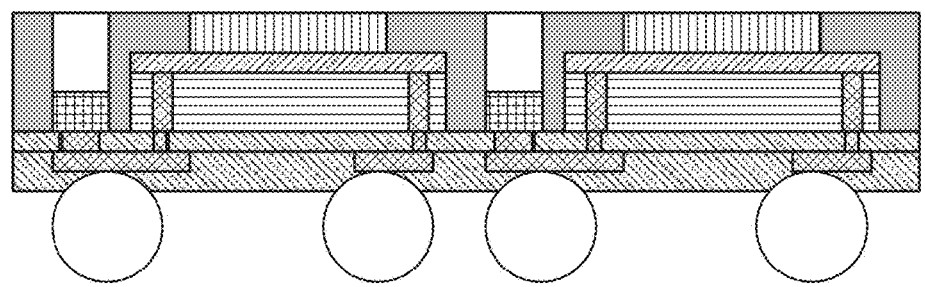
FIG. 9N is a schematic view showing a step S915 of the manufacturing method of the fingerprint identification device according to a preferred embodiment of the present invention.

In a step S915, a grinding process is performed on a molding surface of the reconstruction wafer to expose the photic layer on each of the image sensing ICs and a photic material of the light emitting circuit, as shown in FIG. 9N, FIG. 9N is a schematic view showing the step S915 of the manufacturing method of the fingerprint identification device according to a preferred embodiment of the present invention.

Figure 9O:
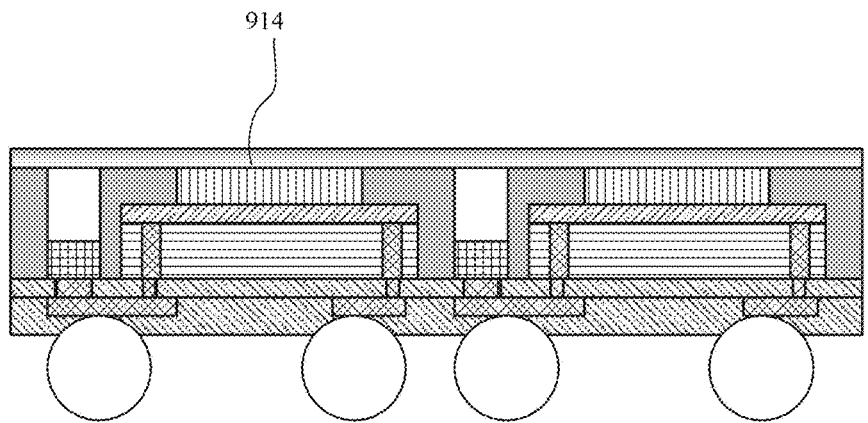
FIG. 9O is a schematic view showing a step S916 of the manufacturing method of the fingerprint identification device according to a preferred embodiment of the present invention.

In a step S916, a coating process is performed on the molding surface of the reconstruction wafer having been ground, so that a protection film covers the photic layer of each of the image sensing ICs and a photic material of the light emitting circuit, as shown in FIG. 9O. FIG. 9O is a schematic view showing the step S916 of the manufacturing method of the fingerprint identification device according to a preferred embodiment of the present invention. Referring to FIG. 9O, the surface after grinding is coated with a protection film 914.

Figure 9P:
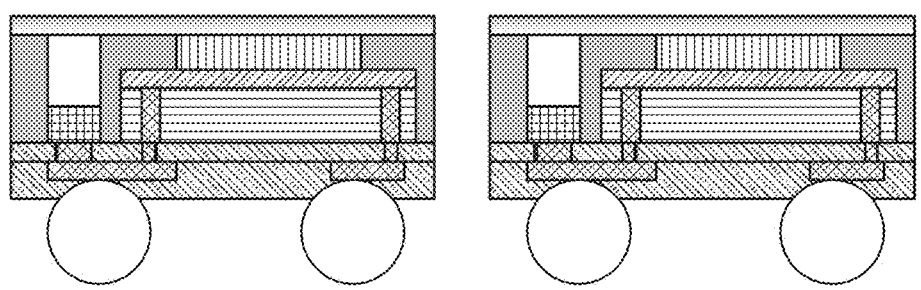
FIG. 9P is a schematic view showing a step S917 of the manufacturing method of the fingerprint identification device according to a preferred embodiment of the present invention.

In a step S917, a dicing process is performed on the reconstruction wafer to obtain the multiple fingerprint identification devices, as shown in FIG. 9P. FIG. 9P is a schematic view showing the step S917 of the manufacturing method of the fingerprint identification device according to a preferred embodiment of the present invention.

In the above-mentioned embodiment, the step S916 of coating the protection film is an optional design. The manufacturer can select to perform the step S916 or not perform the step S916. The presence or absence of the protection film does not affect the manufacturing method of the present invention. So, the present invention is not restricted to the step S916.

Figure 10:
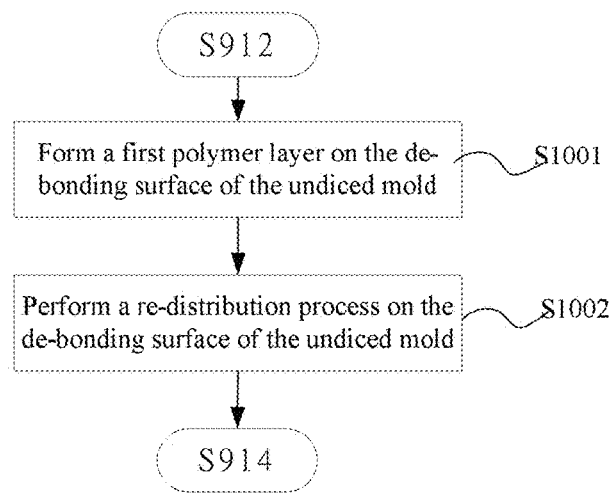
FIG. 10 is a detailed flow chart showing the step S913 of the manufacturing method of the fingerprint identification device according to a preferred embodiment of the present invention.

FIG. 10 is a detailed flow chart showing the step S913 of the manufacturing method of the fingerprint identification device according to a preferred embodiment of the present invention. Referring to FIG. 10, in the above-mentioned embodiment, disposing the re-distribution layer on the de-bonding surface of the reconstruction wafer described by the step S913 may include the following sub-steps.

Figure 10A:
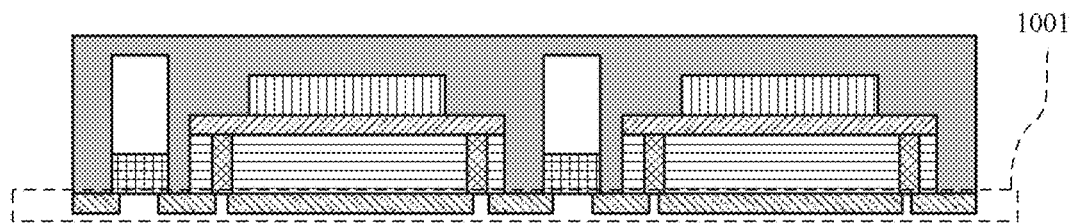
FIG. 10A is a schematic view showing a step S1001 of the manufacturing method of the fingerprint identification device according to a preferred embodiment of the present invention.

In a step S1001 following the step S912, a first polymer layer is formed on the de-bonding surface of the reconstruction wafer, as shown in FIG. 10A. FIG. 10A is a schematic view showing the step S1001 of the manufacturing method of the fingerprint identification device according to a preferred embodiment of the present invention. Referring to FIG. 10A, symbol 1001 represents the first polymer layer. In this embodiment, the first polymer layer 1001 is also pre-reserved for the TSVs and the input/output nodes of the light emitting component to facilitate the subsequent re-distribution.

In a step S1002, a re-distribution process is performed on the de-bonding surface of the reconstruction wafer, as shown in FIG. 9L. By this step S1002, the TSVs of the image sensing IC wafer and the input/output nodes of the light emitting component can be electrically connected to externally embedded solder balls.

Figure 11:
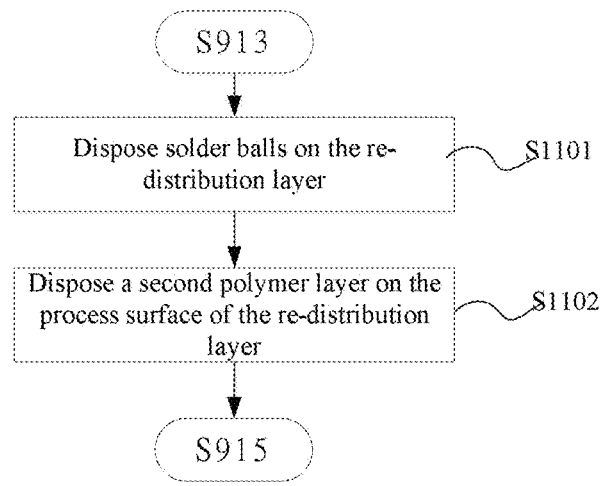
FIG. 11 is a detailed flow chart showing the step S914 of the manufacturing method of the fingerprint identification device according to a preferred embodiment of the present invention.

FIG. 11 is a detailed flow chart showing the step S914 of the manufacturing method of the fingerprint identification device according to a preferred embodiment of the present invention. Referring to FIG. 11, in the above-mentioned embodiment, disposing the solder ball array on the process surface of the re-distribution layer (RDL) described by the step S914 may include the following sub-steps.

Figure 11A:
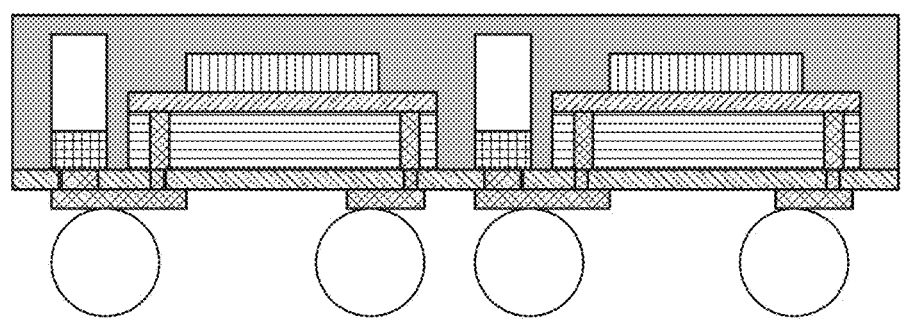
FIG. 11A is a schematic view showing a step S1101 of the manufacturing method of the fingerprint identification device according to a preferred embodiment of the present invention.

In a step S1101, solder balls are disposed on the re-distribution layer, as shown in FIG. 11A. FIG. 11A is a schematic view showing the step S1101 of the manufacturing method of the fingerprint identification device according to a preferred embodiment of the present invention. Referring to FIG. 11A, generally speaking, the solder ball can be a solder ball or a gold ball. The present invention is not restricted thereto.

Figure 11B:
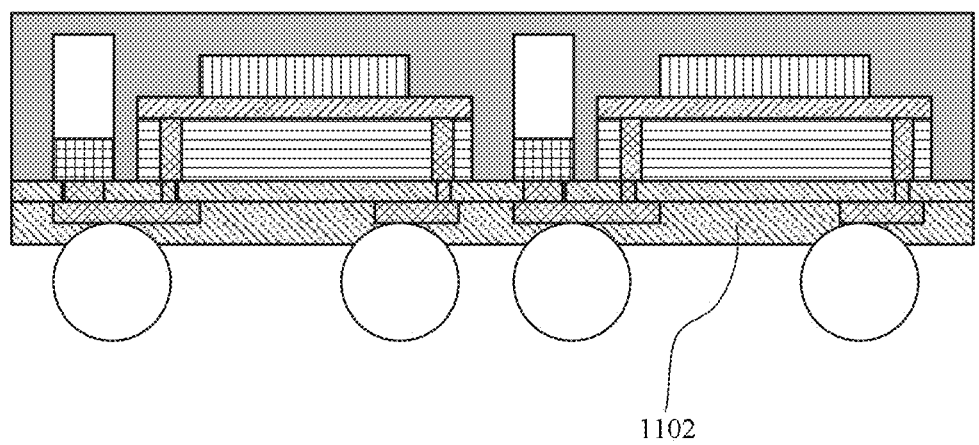
FIG. 11B is a schematic view showing a step S1102 of the manufacturing method of the fingerprint identification device according to a preferred embodiment of the present invention.

In a step S1102, a second polymer layer is disposed on the process surface of the re-distribution layer, as shown in FIG. 11B. FIG. 11B is a schematic view showing the step S1102 of the manufacturing method of the fingerprint identification device according to a preferred embodiment of the present invention. Referring to FIG. 11B, symbol 1102 represents the second polymer layer.

All of the above-mentioned processes can be performed in the semiconductor manufacturing machine. In addition to the system in package (SIP), the volume of the fingerprint identification device can be reduced.

In summary, the essence of the present invention resides in a photic layer disposed above the image sensing IC used in the fingerprint identification, and the photic layer allows the light ray to pass. Thereafter, the light emitting circuit and the image sensing IC used in the fingerprint identification are packaged in the same integrated circuit by way of packaging. Accordingly, the light emitting circuit and the image sensing IC used in the fingerprint identification can be integrated into the same integrated circuit. Because the mold material encloses the above-mentioned image sensing IC used in the fingerprint identification in the package, a natural light obstructing member is constituted between the image sensing IC and the light emitting circuit. Thus, it is possible to prevent the light ray of the light emitting circuit from being directly incident to the image sensing IC used in the fingerprint identification, so that the read fingerprint is clearer.

In addition, in order to further reduce the volume of the fingerprint identification device, after the fingerprint identification integrated circuits have been manufactured on the wafer in the production process, the back of the wafer is firstly thinned. Then, the TSV technology is performed on the needed input/output pins to pull out the metal contact points under the wafer to fix the input/output nodes of the fingerprint identification integrated circuits under the wafer. Thereafter, the above-mentioned input/output nodes are pulled out through the re-distribution layer, and the photic layer is disposed above the fingerprint identification surface. Then, the wafer is diced into individual chips of the fingerprint identification integrated circuits, each the individual chips is bonded to a carrier, and the light emitting circuits are disposed around the chip. Thereafter, the processes, such as molding, solder ball arranging, dicing and the like, are performed to obtain multiple fingerprint identification devices. Accordingly, each of the fingerprint identification devices can be further reduced, and the volume and the cost are reduced.

While the present invention has been described by way of examples and in terms of preferred embodiments, it is to be understood that the present invention is not limited thereto. To the contrary, it is intended to cover various modifications. Therefore, the scope of the appended claims should be accorded the broadest interpretation so as to encompass all such modifications.

What is claimed is:

1. A fingerprint identification device, comprising:
a solder ball array comprising a plurality of solder balls;
a re-distribution layer (RDL) disposed on the solder ball array and electrically connected to the solder balls;
an image sensing integrated circuit (IC) comprising a plurality of through silicon vias (TSVs), wherein each of the TSVs comprises an electroconductive material, wherein the TSVs are correspondingly electrically connected to the solder balls, respectively, through the re-distribution layer;
a light emitting circuit, which is disposed on one side of the image sensing IC, emits a specified light source, and comprises a first connecting conductor electrically connected to a specific one of the TSVs of the image sensing IC through the re-distribution layer, wherein the image sensing IC controls the light emitting circuit through the specific TSV;
a photic layer disposed on the image sensing IC, wherein the photic layer allows light to pass through and enter the image sensing IC; and
a molding material enclosing the image sensing IC, wherein the molding material obstructs a light travelling path between the light emitting circuit and the image sensing IC to prevent directly illuminating light of the light emitting circuit from entering the image sensing IC to enhance a fingerprint identification quality.

2. The fingerprint identification device according to claim 1, wherein the photic layer comprises:
a spatial filter disposed on the image sensing IC, wherein the spatial filter has multiple neighboring light channels, wherein the light channel restricts an angle of light entering the image sensing IC to prevent scattered light from entering the image sensing IC.

3. The fingerprint identification device according to claim 1, wherein the light emitting circuit comprises:
a specific light emitting circuit, which is disposed on one side of the image sensing IC and electrically connected to the image sensing IC.

4. The fingerprint identification device according to claim 1, wherein the light emitting circuit comprises:
a visible light emitting circuit disposed on the one side of the image sensing IC and electrically connected to the image sensing IC,
wherein when a fingerprint identification is performed, the visible light emitting circuit emits visible light to make a user obtain a finger placement position through the visible light.

5. The fingerprint identification device according to claim 2, wherein the light channels of the spatial filter constitute a two-dimensional array.

6. The fingerprint identification device according to claim 1, wherein a sensing surface of the image sensing IC faces upwards.

7. A mobile device, comprising:
a control circuit;
a display panel, electrically connected to the control circuit;
a protective cover, disposed on the display panel; and
a fingerprint identification device, comprising:
a solder ball array comprising a plurality of solder balls;
a re-distribution layer (RDL) disposed on the solder ball array and electrically connected to the solder balls;
an image sensing integrated circuit (IC) comprising a plurality of through silicon vias (TSVs), wherein each of the TSVs comprises an electroconductive material, wherein the TSVs are correspondingly electrically connected to the solder balls, respectively, through the re-distribution layer;
a light emitting circuit, which is disposed on one side of the image sensing IC, emits a specified light source, and comprises a first connecting conductor electrically connected to a specific one of the TSVs of the image sensing IC through the re-distribution layer, wherein the image sensing IC controls the light emitting circuit through the specific TSV;
a photic layer disposed on the image sensing IC, wherein the photic layer allows light to pass through and enter the image sensing IC; and
a molding material enclosing the image sensing IC, wherein the molding material obstructs a light travelling path between the light emitting circuit and the image sensing IC to prevent directly illuminating light of the light emitting circuit from entering the image sensing IC to enhance a fingerprint identification quality.

8. The mobile device according to claim 7, wherein the photic layer comprises:
a spatial filter disposed on the image sensing IC, wherein the spatial filter has multiple neighboring light channels, wherein the light channel restricts an angle of light entering the image sensing IC to prevent scattered light from entering the image sensing IC.

9. The mobile device according to claim 7, wherein the light emitting circuit comprises:
a specific light emitting circuit, which is disposed on one side of the image sensing IC and electrically connected to the image sensing IC.

10. The mobile device according to claim 7, wherein the light emitting circuit comprises:
a visible light emitting circuit disposed on the one side of the image sensing IC and electrically connected to the image sensing IC,
wherein when a fingerprint identification is performed, the visible light emitting circuit emits visible light to make a user obtain a finger placement position through the visible light.

11. The fingerprint identification device according to claim 8, wherein the light channels of the spatial filter constitute a two-dimensional array.

12. The fingerprint identification device according to claim 7, wherein a sensing surface of the image sensing IC faces upwards.

13. A method for manufacturing fingerprint identification devices, the method comprising:
bonding an image sensing integrated circuit (IC) wafer to a first carrier, wherein image sensing surfaces of the image sensing IC wafer are bonded to the first carrier;
performing a through silicon via (TSV) process on the image sensing IC wafer on the first carrier;
de-bonding the image sensing IC wafer from the first carrier;
bonding a second carrier to a TSV processing surface of the image sensing IC wafer;
disposing a photic layer on each of sensing surfaces of image sensing ICs on the image sensing IC wafer;
de-bonding the image sensing IC wafer from the second carrier;
dicing the image sensing IC wafer to obtain the image sensing ICs;
bonding the image sensing ICs to a third carrier, and disposing a light emitting circuit on one side of each of the image sensing ICs;
performing a molding process on each of the image sensing ICs and each of the corresponding light emitting circuits to obtain an undiced mold;
de-bonding the undiced mold from the third carrier;
disposing a re-distribution layer on a de-bonding surface of the undiced mold;
disposing a solder ball array on a process surface of the re-distribution layer;
performing a grinding process on a molding surface of the undiced mold to expose the photic layer on each of the image sensing ICs and a photic material of the light emitting circuit; and
performing a dicing process to obtain the fingerprint identification device.

14. The method for manufacturing the fingerprint identification device according to claim 13, further comprising, before the dicing process:
performing a coating process to cover a protection film on the photic layer on each of the image sensing ICs and the photic material of the light emitting circuit.

15. The method for manufacturing the fingerprint identification device according to claim 13, wherein disposing the re-distribution layer on the de-bonding surface of the undiced mold further comprises:
forming a first polymer layer on the de-bonding surface of the undiced mold; and
performing a re-distribution process on the de-bonding surface of the undiced mold so that TSVs of the image sensing IC wafer are electrically connected to externally disposed metal bumps.

16. The method for manufacturing the fingerprint identification device according to claim 13, wherein disposing the solder ball array on the process surface of the re-distribution layer comprises:
  disposing solder balls on the re-distribution layer; and
  disposing a second polymer layer on the process surface of the re-distribution layer.

17. The method for manufacturing the fingerprint identification device according to claim 13, further comprising, before performing the TSV process on the image sensing IC wafer on the first carrier:
  performing a wafer substrate thinning process.

* * * * *